US009589088B1

(12) United States Patent
Mishra et al.

(10) Patent No.: US 9,589,088 B1
(45) Date of Patent: Mar. 7, 2017

(54) PARTITIONING MEMORY IN PROGRAMMABLE INTEGRATED CIRCUITS

(71) Applicant: Xilinx, Inc., San Jose, CA (US)

(72) Inventors: Pradeep Kumar Mishra, Hyderabad (IN); Gangadhar Budde, Maharashtra (IN); Somdutt Javre, Seoni (IN); Siddharth Rele, Maharashtra (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/746,646

(22) Filed: Jun. 22, 2015

(51) Int. Cl.
*G06F 17/50* (2006.01)

(52) U.S. Cl.
CPC ........ *G06F 17/505* (2013.01); *G06F 17/5054* (2013.01)

(58) Field of Classification Search
CPC ............... G06F 1/1632; G06F 12/0661; G06F 12/0684; G06F 12/0804; G06F 12/0897; G06F 12/1441; G06F 13/1636; G06F 13/1694; G06F 1/1616; G06F 11/267; G06F 13/4217; G06F 13/4243; G06F 17/5031; G06F 17/5072; G06F 17/5068; G06F 17/5077; G06F 17/5045
USPC .................................................. 716/100–106
See application file for complete search history.

(56) References Cited

U.S. PATENT DOCUMENTS

| | | | |
|---|---|---|---|
| 5,801,547 A | 9/1998 | Kean | |
| 8,146,027 B1 * | 3/2012 | Lindop | G06F 17/5045 703/15 |
| 8,356,125 B1 | 1/2013 | Secatch | |
| 8,468,510 B1 | 6/2013 | Sundararajan et al. | |
| 8,473,904 B1 | 6/2013 | Sundararajan et al. | |
| 8,650,517 B1 * | 2/2014 | Sundararajan | G06F 17/5045 716/101 |
| 8,677,306 B1 * | 3/2014 | Andreev | G06F 11/267 714/30 |
| 8,745,561 B1 * | 6/2014 | Garg | G06F 17/5031 703/16 |

(Continued)

OTHER PUBLICATIONS

U.S. Appl. No. 14/464,654, filed Aug. 20, 2014, Ansari et al., San Jose, CA USA.

(Continued)

*Primary Examiner* — Binh Tat
(74) *Attorney, Agent, or Firm* — LeRoy D. Maunu; Jonathan B. Soike

(57) ABSTRACT

Various example implementations are directed to circuits and methods for partitioning a memory for a circuit design in a programmable IC. A user interface is provided for a user to define subsystems, master circuits, memory segments, and permissions for accessing the memory segments by the master circuits. For each defined memory segment, a respective access control entry is generated that includes data for determining master circuits that are permitted access to the memory segment by the user-defined permissions. A first portion of configuration data is generated that is configured to cause a memory management circuit in the programmable IC to enforce access to address ranges, corresponding to the respective memory segments, in a memory of the programmable IC according to the respective access control entries. A second portion of configuration data is generated that is configured to cause programmable resources of the programmable IC to implement the circuit design.

18 Claims, 9 Drawing Sheets

(56) References Cited

U.S. PATENT DOCUMENTS 9,378,003 B1    6/2016    Sundararajan et al.
2014/0282312 A1*    9/2014    Stamness .............. G06F 17/505
                                                                                 716/106

OTHER PUBLICATIONS

U.S. Appl. No. 14/638,692, filed Mar. 4, 2015, Ahmad et al., San Jose, CA USA.

* cited by examiner

US 9,589,088 B1

PARTITIONING MEMORY IN PROGRAMMABLE INTEGRATED CIRCUITS

TECHNICAL FIELD

The disclosure generally relates to programmable integrated circuits (IC).

BACKGROUND

Programmable ICs are devices that can be programmed to perform specified logic functions. One type of programmable IC, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a circuit design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Some programmable ICs include one or more embedded processors that are capable of executing program code. A processor can be fabricated as part of the same die that includes the programmable logic circuitry and the programmable interconnect circuitry, also referred to collectively as the "programmable circuitry" of the IC. It should be appreciated that execution of program code within a processor is distinguishable from "programming" or "configuring" the programmable circuitry that may be available on an IC. The act of programming or configuring the programmable circuitry of an IC results in the implementation of different physical circuitry as specified by the configuration data within the programmable circuitry.

SUMMARY

Various example implementations are directed to circuits and methods for partitioning a memory for a circuit design implemented in a programmable IC. In an example implementation, a system includes a processor and a memory coupled to the processor. The memory includes a set of instructions that, when executed by the processor, cause the processor to provide a user interface. The user interface includes a mechanism for a user to define one or more subsystems of a circuit design, one or more master circuits of the circuit design for each subsystem, memory segments for each subsystem, and permissions for accessing the memory segments in each subsystem by the master circuits in the subsystem. Each master circuit has a respective identifier (ID). The instructions further cause the processor to generate respective access control entries for each of the memory segments in response to definition of one or more subsystems, master circuits, memory segments, and permissions by the user. Each access control entry includes data for determining IDs of master circuits that are permitted access to the memory segment by the user-defined permissions. The instructions further cause the processor to generate a set of configuration data. The set of configuration data includes a first portion configured to, when input to a programmable IC, cause a memory management circuit in the programmable IC to enforce access to address ranges, corresponding to the respective memory segments, in a memory of the programmable IC according to the respective access control entries. The set of configuration data also includes a second portion configured to, when input to the programmable IC, cause programmable resources of the programmable IC to implement circuitry specified by the circuit design.

A method is also disclosed for partitioning a memory for a circuit design implemented in a programmable IC. Program code is executed that implements a user interface on a processor. The user interface includes mechanisms for a user to define subsystems, master circuits, memory segments, and permissions for accessing the memory segments by the master circuits. For each defined memory segment, a respective access control entry is generated that includes data for determining master circuits that are permitted access to the memory segment by the user-defined permissions. A first portion of configuration data is generated that is configured to cause a memory management circuit in the programmable IC to enforce access to address ranges, corresponding to the respective memory segments, in a memory of the programmable IC according to the respective access control entries. A second portion of configuration data is generated that is configured to cause programmable resources of the programmable IC to implement the circuit design.

BRIEF DESCRIPTION OF THE DRAWINGS

Various aspects and features of the disclosed circuits and methods will become apparent upon review of the following detailed description and upon reference to the drawings in which.

DETAILED DESCRIPTION

Figure 1:
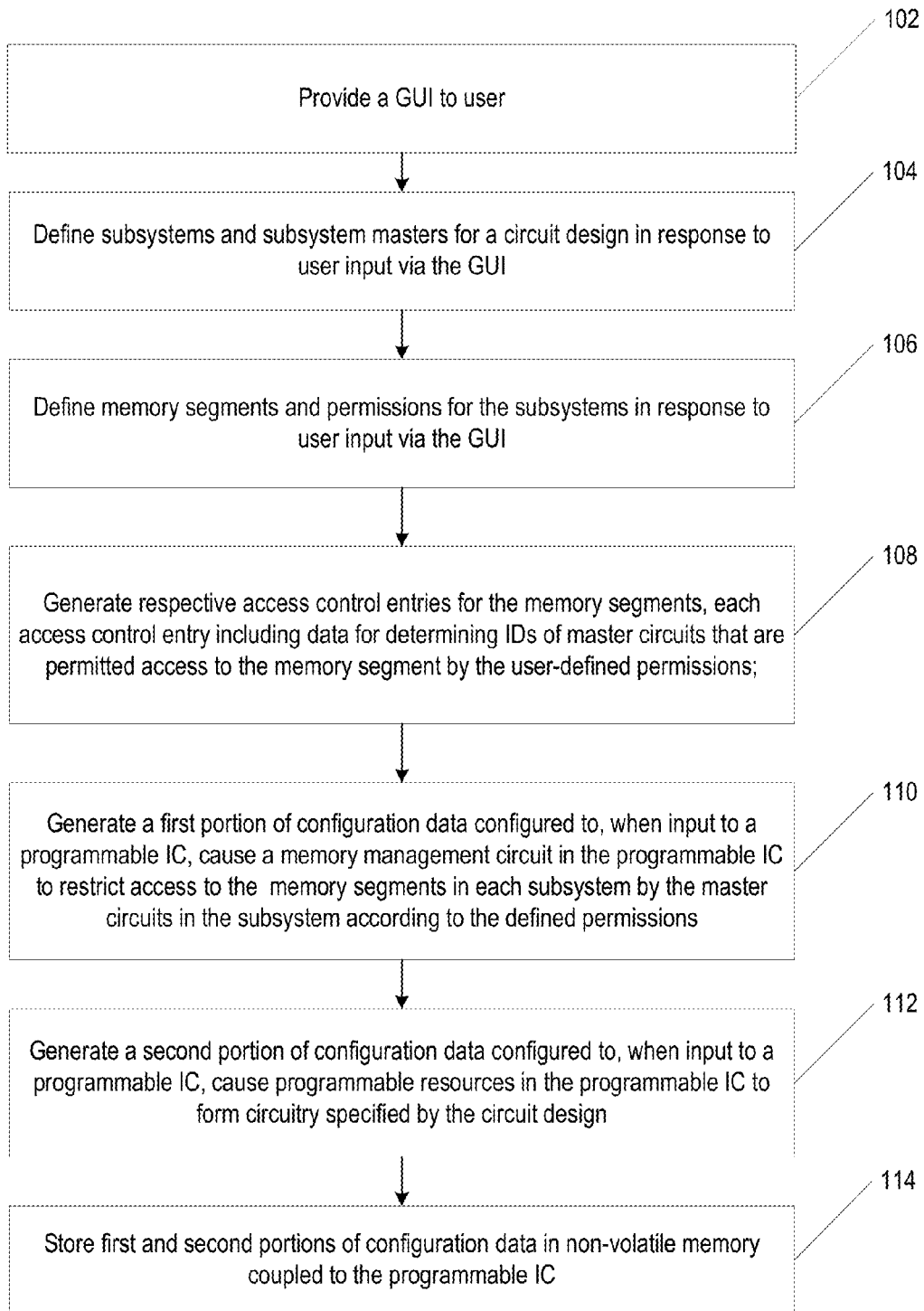
FIG. 1 shows an example process for partitioning memory for a circuit design in a programmable IC.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

Some programmable ICs include a memory circuit that may be used by logic circuits of multiple subsystems for data storage or for communicating data between the logic circuits. However, conflicts may occur when multiple logic circuits access a shared memory. For example, data written to the memory by one logic circuit may be mistakenly overwritten by another processor before the data can be read by the intended recipient. In some approaches, individual circuits or subsystems may be manually configured by a designer to only access designated portions of a shared memory. However, as the number of circuits or subsystems in a system that access a shared memory increases, it becomes increasingly difficult for a designer to manually design and/or configure circuits to avoid memory conflict. Furthermore, malicious software may cause a processor or other logic circuit to violate memory access permissions intended by a designer.

Circuits and methods are disclosed for partitioning a shared memory between two or more subsystems of a circuit design. In some implementations, a software-based design tool includes a user interface for a user to define subsystems, memory segments, circuits that may initiate data transactions with the memory segments, and permissions for accessing the memory segments by the master circuits. For ease of reference, the defined circuits that may initiate data transactions that reference the memory segment may be referred to as master circuits. Data transactions may include, for example, a request to read data from a memory address or a request to write data to a memory address. Each defined memory segment specifies a respective address range of a memory. The defined permissions include information that indicates which ones of the defined master circuits may access each memory segment. The defined permissions may also indicate the type of access the master circuits should have to the memory segments. The specified type of access may include, for example, read/write access, read only access, and/or no access. The design tool is configured to automatically generate and/or configure circuits to restrict access to user-defined memory segments according to the user-defined permissions.

In some implementations, the design tool may automatically generate configuration data to configure a memory management circuit to restrict access to one or more memory segments according to the user-defined permissions. Additionally or alternatively, the design tool may automatically supplement a circuit design to include one or more circuits configured to restrict access to one or more memory segments according to the user-defined permissions. For ease of explanation, examples may be primarily described with reference to a design tool that automatically generates configuration data that causes a memory management circuit of a programmable IC to restrict access to memory segments according to the user-defined permissions. Such examples may be adapted to instead automatically generate configuration data to cause programmable resources to implement the memory management circuit.

Turning now to the figures, FIG. 1 shows an example process for partitioning memory for a circuit design in a programmable IC. Using a circuit design tool, a graphical user interface (GUI) is provided to a user at block 102. The GUI includes a user interface for a user to define subsystems of the circuit design, memory segments of a memory of the programmable IC, master circuits in the subsystem, and permissions for accessing the memory segments by the master circuits. At block 104, subsystems and subsystem master circuits are defined for the circuit design in response to user input via the GUI. In some implementations, a subsystem and master circuits of the subsystem may be defined by selecting existing circuits of the circuit design from a graphical circuit design layout, for example. Alternatively or additionally, a user may define subsystems or master circuits by selecting template subsystems and/or master circuits to be added to a circuit design from a library of pre-defined subsystems and/or circuits. At block 106, memory segments and access permissions are defined for the subsystems in response to user input via the GUI. Memory segments may be defined, for example, by specifying address ranges of one or more user-selected memories included in a target programmable IC architecture. An example GUI is discussed in more detail with reference to FIG. 7.

At block 108, a first portion of configuration data is generated. The first portion of configuration data is configured to, when input to a programmable IC, cause a memory management circuit in the programmable IC to restrict access to the memory segments in each subsystem by the master circuits according to the defined permissions. Example processes for generating the first portion of configuration data are discussed with reference to FIGS. 2-4.

At block 110, a first portion of configuration data is generated. The first portion of configuration data is configured to, when input to a programmable IC, cause a memory management circuit in the programmable IC to restrict access to the memory segments in each subsystem by the master circuits according to the access control entries. Example processes for generating the first portion of configuration data are discussed with reference to FIGS. 2-4. At block 112, a second portion of configuration data is generated. The second portion of configuration data is configured to, when input to a programmable IC, cause programmable resources in the programmable IC to implement circuitry specified by the circuit design. Generating the second portion of configuration data may include, for example, compilation and synthesis of HDL code, placement and routing of the synthesized circuit design, optimization of the placed and routed design, and generating configuration data to implement the optimized design. At block 114, the first and second portions of configuration data are stored in a non-volatile memory coupled to the programmable IC.

Figure 2:
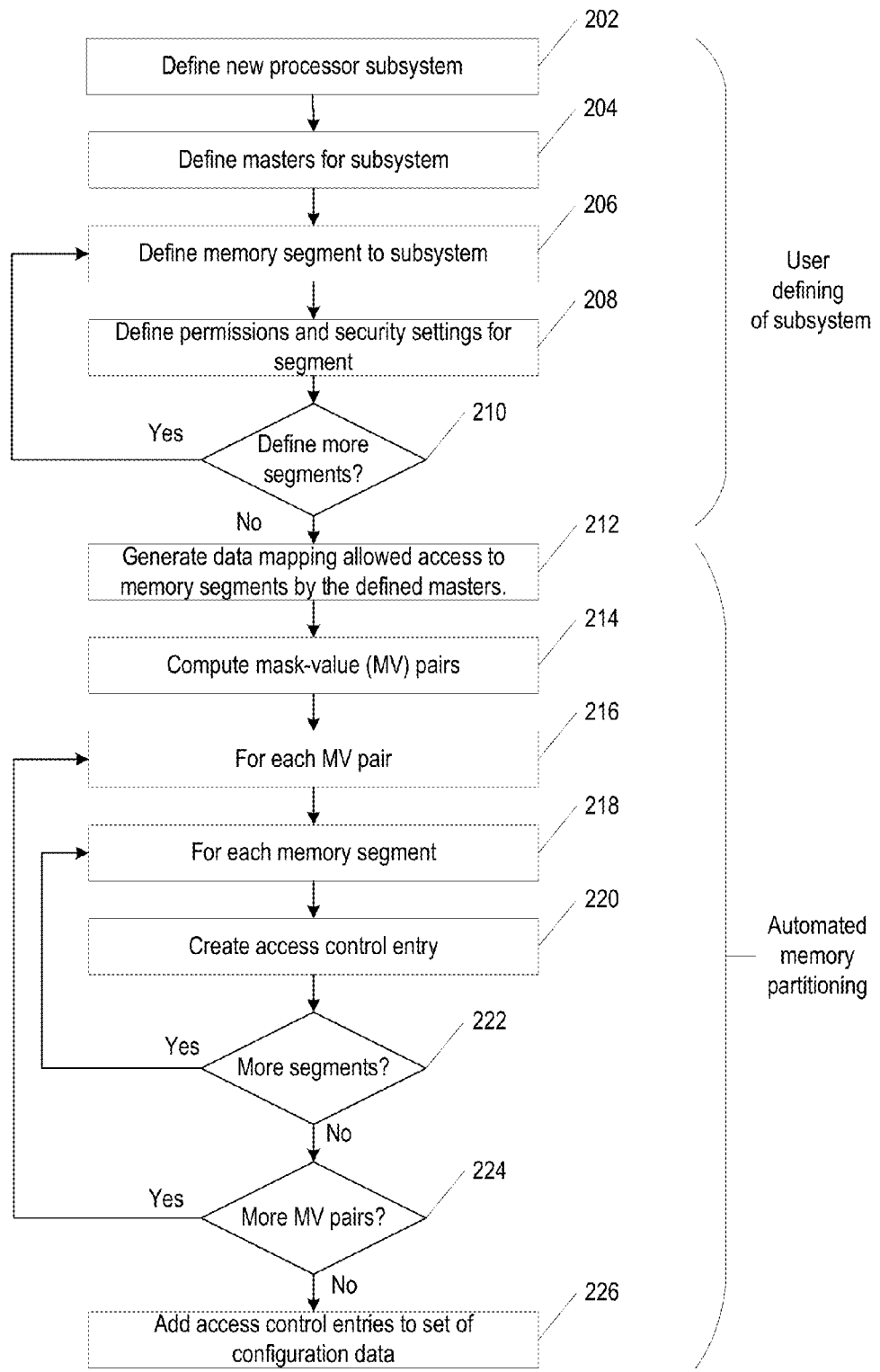
FIG. 2 shows a process for automatically generating configuration data configured to cause a memory management circuit in the programmable IC to enforce access to user-defined memory segments by user-defined master circuits according to user specified permissions.

FIG. 2 shows a process for automatically generating configuration data that may be used to configure a memory management circuit in the programmable IC to enforce access to user-defined memory segments by user-defined master circuits according to user specified permissions. At block 202, a new subsystem is created in response to user input via a GUI. At block 204, master circuits are defined for the subsystem in response to user input via the GUI. At block 206, a memory segment is defined for the subsystem in response to user input via the GUI. At block 208, access permissions and/or security settings are defined for the segment in response to user input via the GUI. If more segments are to be defined, decision block 210 directs the process back to block 206. When a user is done defining memory segments, decision block 210 directs the process to block 212. At block 212, data is created to indicate a mapping of permitted access to memory segments by master circuits.

At block 214, mask-value pairs are computed for restricting access to each segment based on identifiers (IDs) of the defined master circuits. A mask-value pair includes an ID value of a master circuit and a mask that indicates one or more bits of the ID value as don't care bits. For ease of reference the ID value for a master circuit may be referred to as a master ID. After masking of the ID value, the masked value may match multiple master IDs. As an illustrative example, a 4-bit mask-value pair may include the binary value '1010' and a mask 'XOOX'. X's in the mask indicate don't care bits which are masked, and O's in the mask indicate bits of interest. Masking of the value '1010' with the mask 'XOOX' produces the result 'X01X'. This result matches the values '0010', '0011', '1010', and '1011'. In some implementations, a mask-value pair may be stored as a separate mask '1010' and value 'XOOX'. In some other implementations, a mask-value pair may be stored as a single value 'X01X'.

The process enters an outer process loop beginning with block 216 and ending with decision block 224. The outer process loop performs the processes of blocks 218, 220, and 222 for each mask-value pair computed at block 214. Blocks 218, 220, and 222 define an inner process loop that is performed for the current mask-value pair for each memory segment defined for the subsystem. For each memory segment, block 220 creates an access control entry indicating access to the memory segment for master circuits indicated by the current mask-value pair. After the outer loop has been performed for each mask-value pair, decision block 224 directs the process to block 226. At block 226, the created access control entries are added to a set of configuration data.

In various implementations, the access control entries may be used to restrict read and/or write access to the defined memory segments. An access control entry may include, for example, one or more mask-value solutions that indicate IDs of master circuits to be allowed the same type of access indicated by the access control entry. For example, if master IDs 0100 and 0101 are each to be permitted read/write access to a memory segment, the access control entry for the memory segment may include 010X as a mask-value solution. In some implementations, multiple access control entries may be used to specify respective groups of IDs having different types of access to the same memory segment. For example, master IDs 0100 and 0101 may have read/write access and master IDs 0111 and 0110 may have read-only access. In some other implementations, an access control entry may include separate sets of mask-value pairs for different types of access to the same memory segment. For ease of explanation, the following examples are primarily described with reference to access control entries having one or more mask-value pair(s) indicating IDs of circuits having a designated access (e.g., read/write access) to a respective memory segment.

Figure 3:
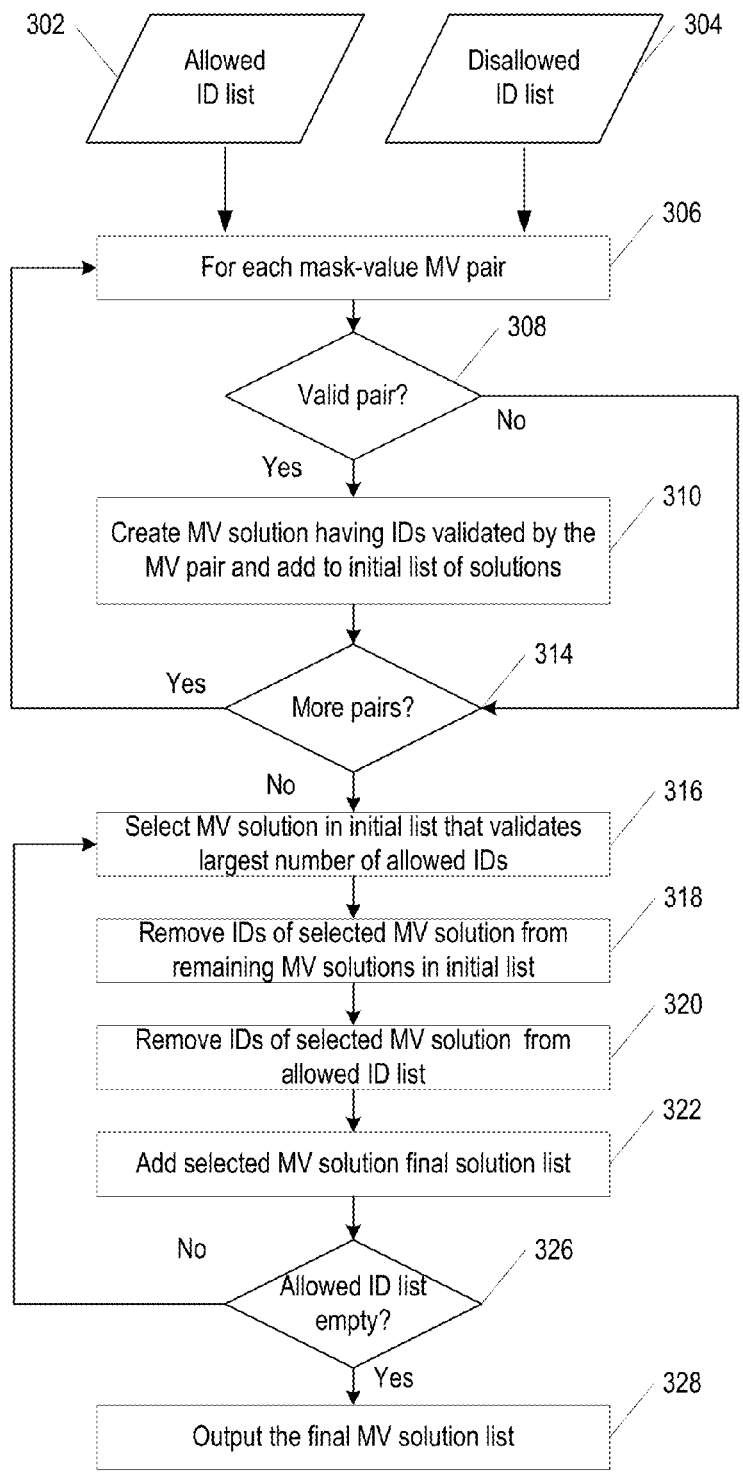
FIG. 3 shows an example process for generating mask-value pairs.

FIG. 3 shows an example process for computing mask-value pairs for a memory segment. The process may be used, for example, to compute mask-value pairs at block 214 in FIG. 2. In this example, the process determines mask-value pairs to identify a group of IDs based on a first list 302 of IDs to be allowed access and a second list 304 of IDs that are not allowed access. The first and second lists may be specified, for example, by a user as part of defining access permissions at block 106 in FIG. 1 and/or block 208 in FIG. 2. Each possible mask-value pair is examined in a process loop starting at block 306 and ending at decision block 314. If a mask-value pair is valid, decision block 308 directs the process to block 310. A mask-value pair is considered valid if it matches at least one ID in an allowed ID list 302 and does not match any IDs in disallowed ID list 304. At block 310, the process creates a mask-value solution having IDs validated by the mask-value pair and adds the solution to an initial list of solutions. If the mask-value pair is not valid, decision block 308 directs the process loop to bypass block 310. After the process loop has been performed for each mask-value pair, decision block 314 directs the process to a second process loop starting at block 316 and ending at decision block 326. The second process loop determines a smallest subset of mask-value solutions that validates all the IDs in the allowed ID list 302.

At block 316, the process selects the mask-value solution in the initial list that validates the largest number of IDs in the allowed list 302. At block 318, IDs of the selected mask-value solution are removed from remaining mask-value solutions in the initial list. At block 320, IDs of the selected mask-value solution are removed from the allowed ID list 302. At block 322, the selected mask-value solution is added to a final solution list. If the allowed ID list is not empty, decision block 326 directs the process to select another solution in the initial list that validates the largest number of allowed IDs and the processes of blocks 318, 320, and 322 are repeated for the selected solution. The second process loop is repeated in this manner until the allowed ID list is empty. Once the allowed ID list is empty, decision block 326 directs the process to block 328. At block 328, the final list of mask-value solutions is output.

Figure 4:
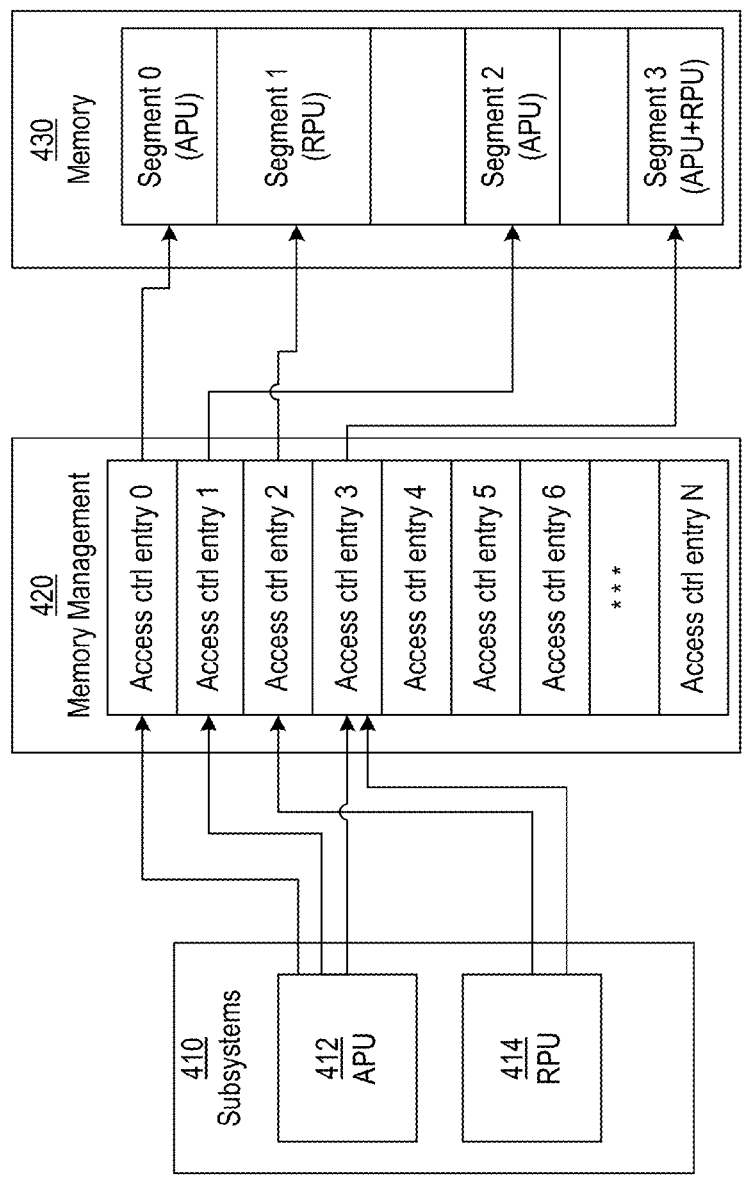
FIG. 4 shows an example device, configured in accordance with one or more implementations.

FIG. 4 shows an example system configured in accordance with one or more implementations. The system includes a plurality of defined subsystems 410, a memory 430, and a memory management circuit 420 configured to control access to defined segments of the memory 430 by the subsystems. In this example, the defined subsystems include an application processing unit subsystem 412 and a real-time processing unit subsystem 414. Each subsystem includes one or more defined master circuits (not shown in FIG. 4) configured to initiate data transactions with memory 430. The defined segments of the memory 430 include four segments (segments 0-3).

The memory management circuit 420 restricts access to each of the defined memory segments, by master circuits in the subsystems 412 and 414, based on a respective access control entry for the memory segment (access control entries 1-N). In an example implementation, each access control entry used by the memory management circuit 420 specifies a range of memory addresses of a memory segment in the memory 430. The access control entry also specifies a mask-value pair indicative of IDs of circuits to be permitted access to the memory segment. In this example, access control entry 0 restricts access to segment 0 of memory 430 to application processing unit (APU) subsystem 412. Access control entry 1 restricts access to segment 2 of memory 430 to APU subsystem 412. Access control entry 2 restricts access to segment 1 of memory 430 to real-time processing unit (RPU) subsystem 414. Access control entry 3 restricts access to segment 3 of memory 430 to APU subsystem 412 and to RPU subsystem 414.

Figure 5:
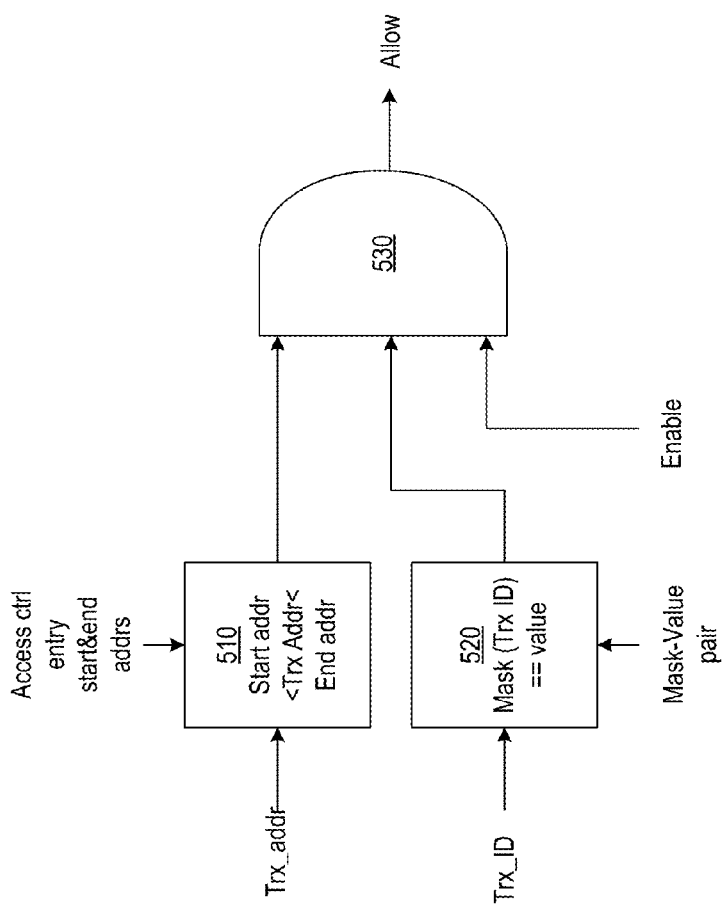
FIG. 5 shows an example circuit for controlling access to a memory segment, in accordance with one or more implementations.

The memory management circuit may use various processes and/or circuit arrangements to restrict access for each defined memory segment. FIG. 5 shows an example circuit 500 for controlling access to a defined memory segment. For example, the memory management circuit 420 in FIG. 4, may use a respective instance of the circuit 500 for processing data transactions and enforcing restrictions for a memory segment specified by a respective access control entry. The circuit 500 includes a first comparison circuit 510 that is configured to compare a destination address (Trx_addr) indicated in a data transaction to start and end addresses of a memory segment specified in the corresponding access control entry. In this example, the comparison circuit 510 outputs a logical 1 if the Trx_addr falls within the start and end addresses specified in the access control entry. Otherwise, the comparison circuit 510 outputs a logical 0. The circuit 500 also includes a second comparison circuit 520 configured to apply a mask, indicated in a mask-value pair specified for the access control entry, to an ID (Trx_ID) of a transaction request and compare the result to a value of the mask-value pair. If the masked Trx_ID matches the value, the comparison circuit 520 outputs a logical 1. Otherwise, the comparison circuit 520 outputs a logical 0.

A logical AND gate 530, receives outputs of the first and second comparison circuits 510 and 520 as first and second inputs. In some implementations, logical AND gate 530 may optionally also receive an enable signal for enabling/disabling access to the memory segment. The enable signal may be use useful, for example, to facilitate powering down an idle subsystem. In this example, the enable signal is set to a logical 1 when access to the memory segment is to be enabled and is set to a logical 0 when access is to be disabled. The logical AND gate 530 outputs a signal indicating whether or not the requested transaction should be allowed. In this example, the logical AND gate 530 outputs a logical 1, indicating the transaction should be allowed, if the outputs of comparison circuits 510 and 520 and the enable signal are all set to logical 1's. Otherwise, the logical AND gate 530 outputs a logical 0, indicating the transaction should not be allowed.

Figure 6:
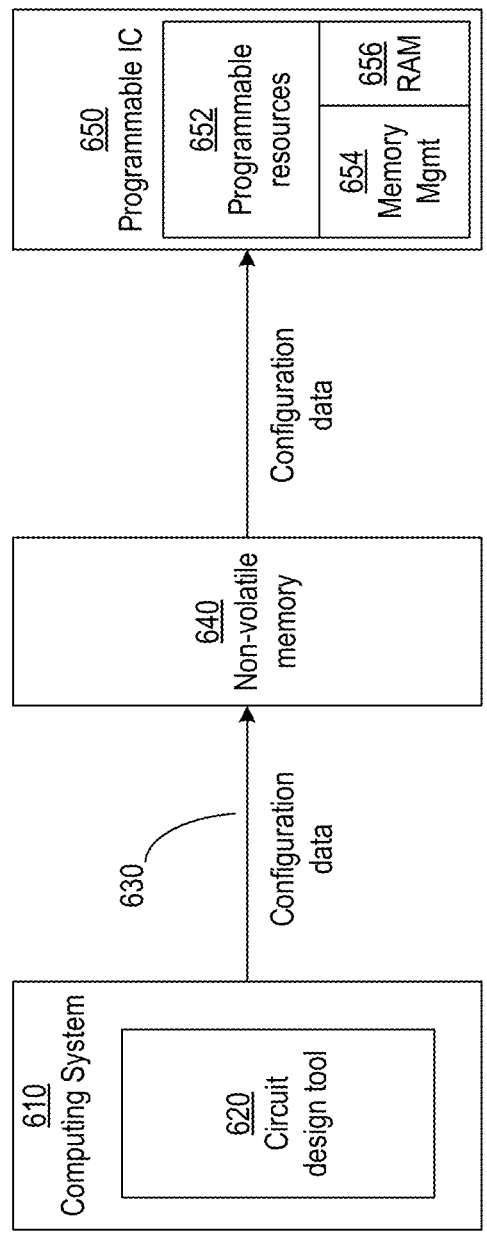
FIG. 6 shows an example system having a software-based circuit design tool configured to partition memory of a programmable IC for subsystems of a circuit design, consistent with one or more implementations.

FIG. 6 shows an example system having a computing system configured to execute a circuit design tool for partitioning memory of a programmable IC for subsystems of a circuit design, consistent with one or more implementations. Software executed on computing system 610 provides a circuit design tool 620 for creation of circuit designs to be implemented on a programmable IC 650. As described with reference to FIG. 1, the circuit design tool 620 provides a graphical user interface (GUI) having interface elements for a user to define subsystems of a circuit design, master circuits in the subsystems, memory segments in a memory 656 of a programmable IC, and access permissions for the memory segments.

The circuit design tool 620 generates a set of configuration data 630 in response to the user defining subsystems, master circuits, memory segments, and permissions. The configuration data includes a first portion configured to cause a memory management circuit 654 in the programmable IC 650 to restrict access to the memory segments in the memory 656 according to the defined access permissions. The configuration data 630 also includes a second portion configured to cause programmable resources 652 to implement circuitry specified in the circuit design. The generated set of configuration data 630 is stored in a non-volatile memory 640 coupled to the programmable IC 650. When the programmable IC is powered on, the configuration data 630 is retrieved from the non-volatile memory 640 and used to configure the programmable resources 652 and memory management circuit 654 as previously described.

Figure 7:
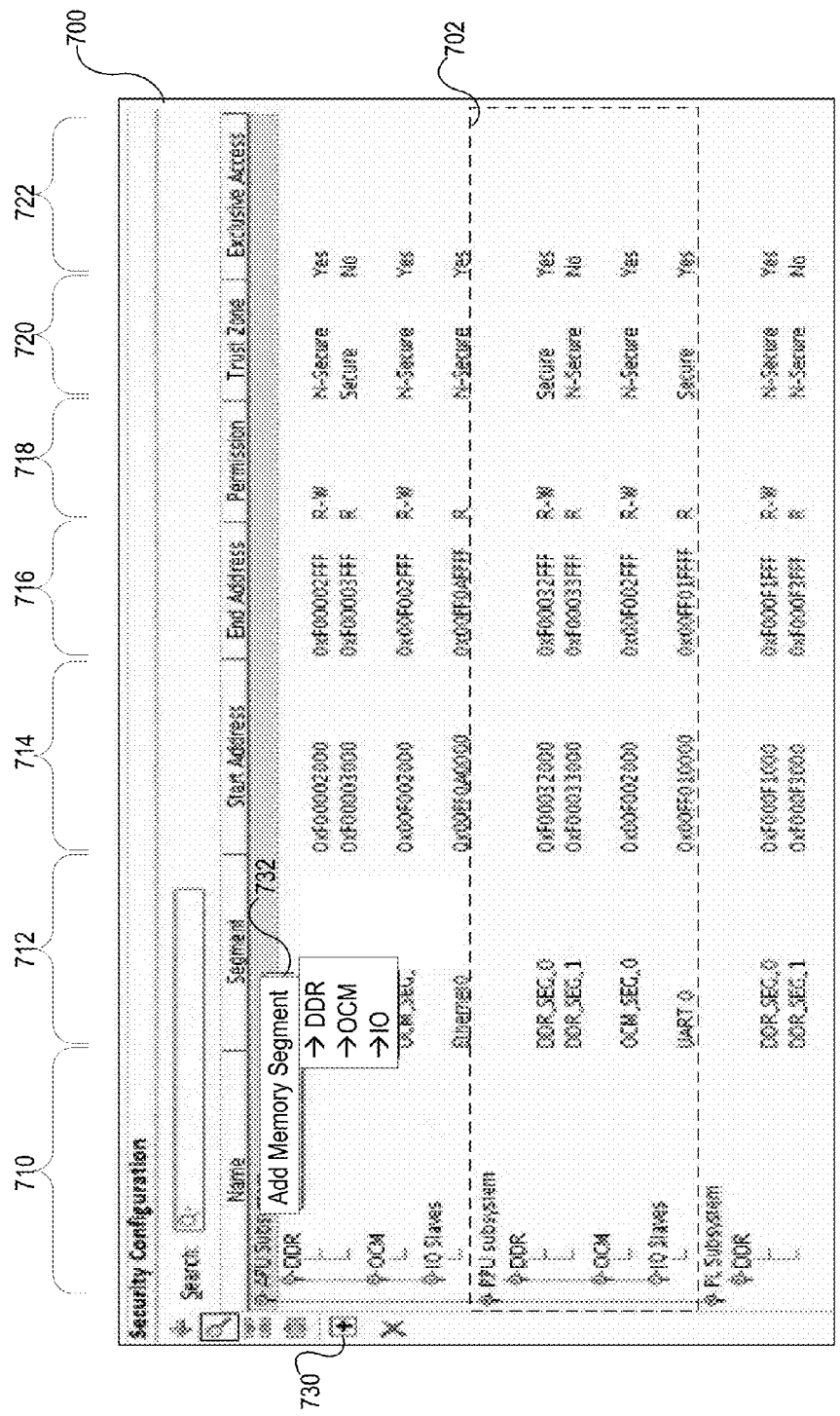
FIG. 7 shows an example graphical user interface (GUI), consistent with one or more implementations.

FIG. 7 shows an example GUI 700 for user configuration of subsystems, master circuits, memory segments, and access permissions, consistent with one or more implementations. In this example, the GUI includes a window configured to display a hierarchical arrangement of subsystems defined for the circuit design, and memory segments defined for each subsystem. Dashed block 702 shows a hierarchical arrangement of memory segments for one subsystem. In this example, the hierarchical arrangement shown in block 702 includes memory segments defined for a double data rate (DDR) memory, an on-chip memory (OCM), and a memory used to buffer data communicated to or from input/output slave devices (IO Slaves).

In this example, names of defined subsystems and available memories in a programmable IC are displayed in column 710. Names of defined memory segments are displayed in column 712. Start and ending addresses for each memory segment are displayed in columns 714 and 716. Read and write permissions for access to the memory segment by circuits of the subsystem are shown in column 718. In this example, the defined memory segments may be categorized as either secure or non-secure. In some implementations, access to secure memory segments may be limited to circuits that are designated as being secure. An indicator of whether or not memory segments are secure is displayed in column 720. An indicator is also displayed in column 722 that indicates whether or not the subsystem has exclusive access to the memory segment.

The GUI may utilize various mechanisms to define and configure subsystems master circuits, and/or memory segments. As one example, the GUI may include a button 730 to add a new subsystem. When the button 730 is pressed, the GUI may present a pop up interface for a user to specify information for the subsystem such as name and/or a portion of a circuit design included in the subsystem. As another example, the GUI may provide pop-up selection 732 to add a new memory segment to a subsystem in response to a user right-clicking on a subsystem. In this example, the pop-up selection 732 allows a user to select one of the available memories to define a new segment. After a new segment is added, a user may define or adjust the name, address range, permissions, or trust and access indicators by double clicking on a textbox in one of the columns 712, 714, 716, 718, 720, and 722 of the segment.

Figure 8:
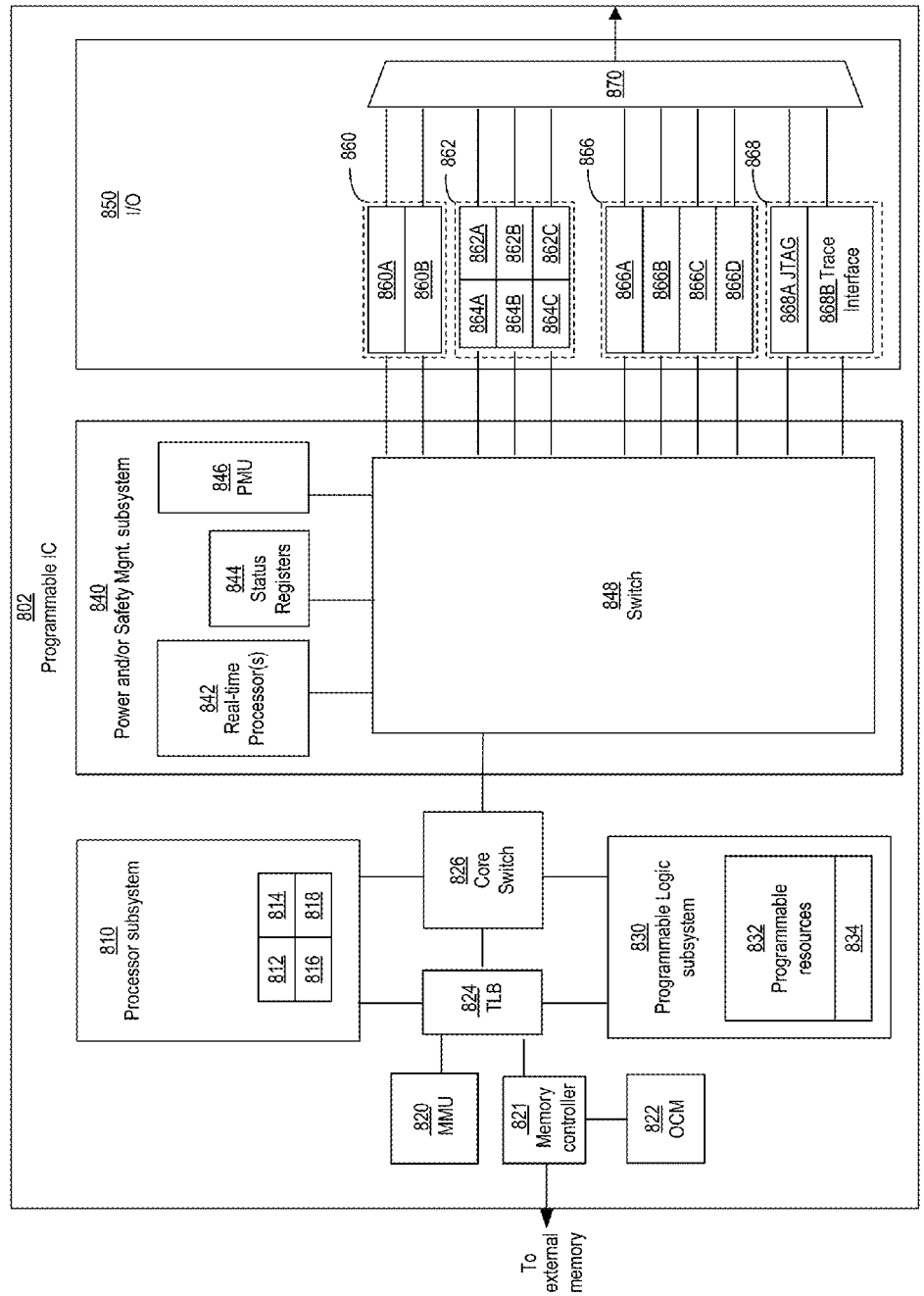
FIG. 8 shows an example computing system for implementing the disclosed processes.

FIG. 8 shows a programmable IC 802 that may be configured in accordance with one or more implementations. The programmable IC may also be referred to as a System On Chip (SOC), which includes a processor subsystem 810 and a programmable logic subsystem 830. The processor subsystem 810 may be programmed to implement a software portion of the user design, via execution of a user program. The program may be specified as part of a configuration data stream or may be retrieved from an on-chip or off-chip data storage device. The processor subsystem 810 may include various circuits 812, 814, 816, and 818 for executing one or more software programs. The circuits 812, 814, 816, and 818 may include, for example, one or more processor cores, floating point units (FPUs), an interrupt processing unit, on chip-memory, memory caches, and/or cache coherent interconnect.

The programmable logic subsystem 830 of the programmable IC 802 may be programmed to implement a hardware portion of a user design. For instance, the programmable logic subsystem may include a number of programmable resources 832, which may be programmed to implement a set of circuits specified in a configuration data stream. The programmable resources 832 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 832 may be programmed by loading a configuration data stream into the configuration memory cells, which define how the programmable interconnect circuits and programmable logic circuits are configured. The collective states of the individual memory cells then determine the function of the programmable resources 832. The configuration data can be read from memory (e.g., from an external PROM) or written into the programmable IC 802 by an external device. In some implementations, configuration data may be loaded into configuration memory cells by a configuration controller 834 included in the programmable logic subsystem 830. In some other implementations, the configuration data may be loaded into the configuration memory cells by a start-up process executed by the processor subsystem 810.

The programmable IC 802 may include various circuits to interconnect the processor subsystem 810 with circuitry implemented within the programmable logic subsystem 830. In this example, the programmable IC 802 includes a core switch 826 that can route data signals between various data ports of the processor subsystem 810 and the programmable logic subsystem 830. The core switch 826 may also route data signals between either of the programmable logic or processing subsystems 810 and 830 and various other circuits of the programmable IC, such as an internal data bus. Alternatively or additionally, the processor subsystem 810 may include an interface to directly connect with the programmable logic subsystem—bypassing the core switch 826. Such an interface may be implemented, for example, using the AMBA AXI Protocol Specification (AXI) as published by ARM.

In some implementations, the processor subsystem 810 and the programmable logic subsystem 830 may also read or write to memory locations of an on-chip memory 822 or off-chip memory (not shown) via memory controller 821. The memory controller 821 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 821 is able to communicate is provided for purposes of illustration only and is not intended as a limitation or to be exhaustive. As shown in FIG. 8, the programmable IC 802 may include a memory management unit 820 and translation look-aside buffer 824 to translate virtual memory addresses used by the subsystems 810 and 830 to physical memory addresses used by the memory controller 821 to access specific memory locations.

The programmable IC may include an input/output (I/O) subsystem 850 for communication of data with external circuits. The I/O subsystem 850 may include various types of I/O devices or interfaces including for example, flash memory type I/O devices, higher performance I/O devices, lower performance interfaces, debugging I/O devices, and/or RAM I/O devices.

The I/O subsystem 850 may include one or more flash memory interfaces 860 illustrated as 860A and 860B. For example, one or more of flash memory interfaces 860 can be implemented as a Quad-Serial Peripheral Interface (QSPI) configured for 4-bit communication. One or more of flash memory interfaces 860 can be implemented as a parallel 8-bit NOR/SRAM type of interface. One or more of flash memory interfaces 860 can be implemented as a NAND interface configured for 8-bit and/or 16-bit communication. It should be appreciated that the particular interfaces described are provided for purposes of illustration and not limitation. Other interfaces having different bit widths can be used.

The I/O subsystem 850 can include one or more interfaces 862 providing a higher level of performance than flash memory interfaces 860. Each of interfaces 862A-862C can be coupled to a DMA controller 864A-864C respectively. For example, one or more of interfaces 862 can be implemented as a Universal Serial Bus (USB) type of interface. One or more of interfaces 862 can be implemented as a gigabit Ethernet type of interface. One or more of interfaces 862 can be implemented as a Secure Digital (SD) type of interface.

The I/O subsystem 850 may also include one or more interfaces 866 such as interfaces 866A-866D that provide a lower level of performance than interfaces 862. For example, one or more of interfaces 866 can be implemented as a General Purpose I/O (GPIO) type of interface. One or more of interfaces 866 can be implemented as a Universal Asynchronous Receiver/Transmitter (UART) type of interface. One or more of interfaces 866 can be implemented in the form of a Serial Peripheral Interface (SPI) bus type of interface. One or more of interfaces 866 can be implemented in the form of a Controller-Area-Network (CAN) type of interface and/or an $I^2C$ type of interface. One or more of interfaces 866 also can be implemented in the form of a timer type of interface.

The I/O subsystem 850 can include one or more debug interfaces 868 such as processor JTAG (PJTAG) interface 868A and a trace interface 868B. PJTAG interface 868A can provide an external debug interface for the programmable IC 802. Trace interface 868B can provide a port to receive debug, e.g., trace, information from the processor subsystem 810 or the programmable logic subsystem 830.

As shown, each of interfaces 860, 862, 866, and 868 can be coupled to a multiplexer 870. Multiplexer 870 provides a plurality of outputs that can be directly routed or coupled to external pins of the programmable IC 802, e.g., balls of the package within which the programmable IC 802 is disposed. For example, I/O pins of programmable IC 802 can be shared among interfaces 860, 862, 866, and 868. A user can configure multiplexer 870, via a configuration data stream to select which of interfaces 860-868 are to be used and, therefore, coupled to I/O pins of programmable IC 802 via multiplexer 870. The I/O subsystem 850, may also include a fabric multiplexer I/O (FMIO) interface (not shown) to connect interfaces 862-868 to programmable logic circuits of the programmable logic subsystem. Additionally or alternatively, the programmable logic subsystem 830 can be configured to implement one or more I/O circuits within programmable logic. In some implementations, the programmable IC 802 may also include a subsystem 840 having various circuits for power and/or safety management. For example, the subsystem 840 may include a power management unit 846 configured to monitor and maintain one or more voltage domains used to power the various subsystems of the programmable IC 802. In some implementations, the power management unit 846 may disable power of individual subsystems, when idle, to reduce power consumption, without disabling power to subsystems in use.

The subsystem 840 may also include safety circuits to monitor the status of the subsystems to ensure correct operation. For instance, the subsystem 840 may include one or more real-time processors 842 configured to monitor the status of the various subsystems (e.g., as indicated in status registers 844). The real-time processors 842 may be configured to perform a number of tasks in response to detecting errors. For example, for some errors, the real-time processors 842 may generate an alert in response to detecting an error. As another example, the real-time processors 842 may reset a subsystem to attempt to restore the subsystem to correct operation. The subsystem 840 includes a switch network 848 that may be used to interconnect various subsystems. For example, the switch network 848 may be configured to connect the various subsystems 810, 830, and 840 to various interfaces of the I/O subsystem 850. In some applications, the switch network 848 may also be used to isolate the real-time processors 842 from the subsystems that are to be monitored. Such isolation may be required by certain application standards (e.g., IEC-61508 SIL3 or ISO-26262 standards) to ensure that the real-time processors 842 are not affected by errors that occur in other subsystems.

Figure 9:
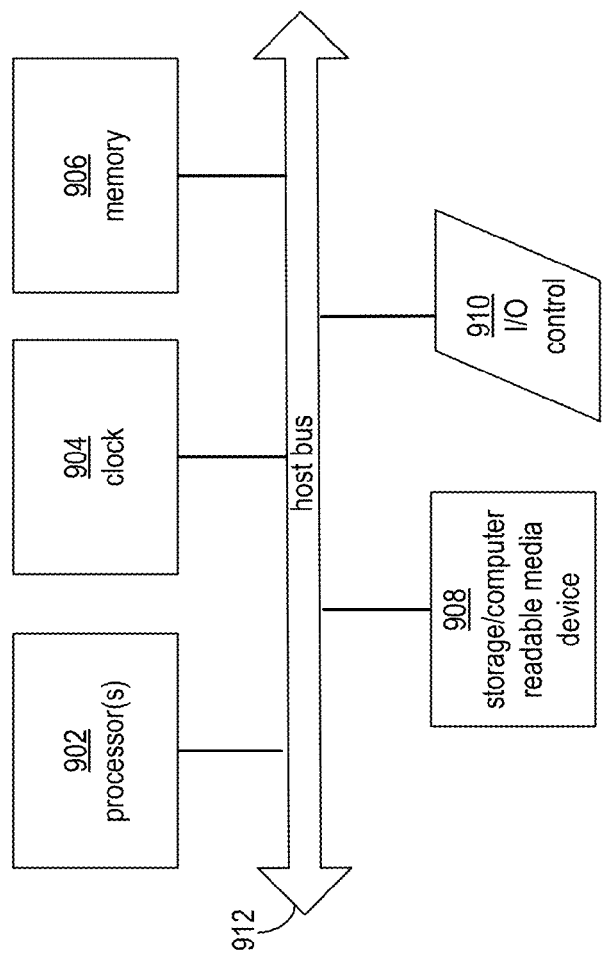
FIG. 9 shows an example programmable IC having a memory management circuit that may be configured to restrict access to user-defined memory segments by user-defined master circuits according to user-defined permissions.

FIG. 9 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 900 includes one or more processors 902, a clock signal generator 904, a memory arrangement 906, a storage arrangement 908, and an input/output control unit 910, all coupled to a host bus 912. The arrangement 900 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 902 may be one or more general purpose processors, or a combination of one or more general purpose processors and suitable co-processors, or one or more specialized processors (e.g., RISC, CISC, pipelined, etc.).

The memory arrangement 906 typically includes multiple levels of cache memory, and a main memory. The storage arrangement 908 may include local and/or remote persistent storage, such as provided by magnetic disks (not shown), flash, EPROM, or other non-volatile data storage. The storage unit may be read or read/write capable. Further, the memory arrangement 906 and storage arrangement 908 may be combined in a single arrangement.

The processor(s) 902 executes the software in storage arrangement 908 and/or memory arrangement 906, reads data from and stores data to the storage arrangement 908 and/or memory arrangement 906, and communicates with external devices through the input/output control arrangement 910. These functions are synchronized by the clock signal generator 904. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

The methods and circuits are thought to be applicable to a variety of systems and applications. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. A system, comprising: a computing device having a processor and a memory coupled to the processor, the memory including a set of instructions that when executed by the processor cause the processor to:

provide a user interface having a mechanism for a user to define one or more subsystems of a circuit design, one or more master circuits of the circuit design for each subsystem, memory segments for each subsystem, and permissions for accessing the memory segments in each subsystem by the master circuits in the subsystem, wherein each master circuit has a respective identifier (ID); and generate in response to definition of one or more subsystems, master circuits, memory segments, and permissions by the user:

respective access control entries for each of the memory segments, each access control entry including data for determining IDs of master circuits that are permitted access to the memory segment by the user-defined permissions, and each access control entry indicates one of the address ranges in the memory of the programmable IC corresponding to the memory segment and a mask-value solution configured to identify IDs of master circuits that are permitted access to the memory segment by the user-defined permissions; and a set of configuration data including:

a first portion configured to, when input to a programmable IC, cause a memory management circuit in the programmable IC to allow or deny access to address ranges, corresponding to the respective memory segments, in a memory of the programmable IC in response to IDs of master circuits matching or not matching the data of the access control entries that identifies IDs of master circuits that are permitted access; and a second portion configured to, when input to the programmable IC, cause programmable resources of the programmable IC to implement circuitry specified by the circuit design.

2. The system of claim 1, wherein:
- the system further includes a non-volatile memory coupled to the computing device and the programmable IC, which is coupled to the non-volatile memory;
- the instructions further cause the processor to store the set of configuration data in the non-volatile memory; and
- the programmable IC is configured to retrieve the set of configuration data from the non-volatile memory in response to being powered on.

3. The system of claim 1, wherein the memory management circuit in the programmable IC includes for each access control entry:
- a respective first circuit configured to output a first signal indicating whether or not a destination address indicated in a transaction request is within the address range indicated by the access control entry; and
- a respective second circuit configured to apply a mask of the mask-value solution indicated by the access control entry to an ID indicated in the transaction request to produce a masked result and output a second signal indicating whether or not the masked result is equal to a value of the mask-value solution.

4. The system of claim 3, wherein the memory management circuit in the programmable IC further includes for each access control entry, a logical AND gate having a first input coupled to receive the first signal and a second input coupled to receive the second signal.

5. The system of claim 1, wherein the instructions cause the processor to generate the first portion of the set of configuration data by:
- computing mask-value pairs; and
- for each combination of one of the mask-value pairs and one of the memory segments defined for the subsystem, creating an entry in the first portion of the set of configuration data for controlling access to the memory segment by the master circuits according to the mask-value pair.

6. The system of claim 5, wherein the processor is configured to compute the mask-value pairs by, for each mask-value combination,
- determining whether or not the mask-value combination validates at least one of the IDs included in an allowed list and invalidates IDs included in a disallowed list;
- in response to the mask-value combination being valid, adding a mask-value solution, indicating each master validated by the mask-value combination, to an initial list of mask-value combinations; and
- selecting a smallest subset of the mask-value solutions in the initial list that indicate all of the master circuits for the subsystem.

7. The system of claim 6, wherein the processor is configured to select the smallest subset of the mask-value solutions in the initial list by performing operations including:
- moving a mask-value solution from the initial list that indicates the largest number of the IDs for the subset to a final list of mask-value combinations;
- removing IDs indicated by the selected mask-value solution from other mask-value solutions in the initial list; and
- repeating the moving and removing steps, in response to the mask-value combinations in the final list indicating less than all of the IDs for the subset.

8. The system of claim 1, wherein the user interface is configured to display a hierarchical arrangement of subsystems defined for the circuit design, and memory segments defined for each subsystem.

9. The system of claim 8, wherein for each memory segment in the hierarchical arrangement, the user interface displays a defined address range of the memory segment, permissions for accessing the memory segment by defined master circuits of the subsystem including the memory segment in the hierarchical arrangement, and an indicator whether or not access to the memory segment is exclusive to the subsystem.

10. A method for partitioning a memory for a circuit design in a programmable IC, comprising:
- executing program code that implements a user interface on a processor, the user interface including interface elements for a user to define one or more subsystems of the circuit design, one or more master circuits of the circuit design for each subsystem, memory segments for each subsystem, and permissions for accessing the memory segments in each subsystem by the master circuits in the subsystem, wherein each master circuit has a respective identifier (ID); and
- generating by the processor, in response to definition by the user through the user interface of one or more subsystems, master circuits, memory segments, and permissions:
  - respective access control entries for each of the memory segments, each access control entry including data for determining IDs of master circuits that are permitted access to the memory segment by the user-defined permissions, and each access control entry indicates a respective address range in a memory of the programmable IC corresponding to the memory segment and one or more mask-value solutions configured to identify IDs of master circuits that are permitted access to the memory segment by the user-defined permissions; and
  - a set of configuration data including:
    - a first portion configured to, when input to the programmable IC, cause a memory management circuit in the programmable IC to allow or deny access to address ranges, corresponding to the respective memory segments, in a memory of the programmable IC in response to IDs of master circuits matching or not matching the data of the access control entries that identifies IDs of master circuits that are permitted access; and
    - a second portion configured to, when input to the programmable IC, cause programmable resources of the programmable IC to implement circuitry specified by the circuit design.

11. The method of claim 10, wherein the generating of the first portion of the set of configuration data includes:
- computing mask-value pairs; and
- for each combination of one of the mask-value pairs and one of the memory segments defined for the subsystem, generating one of the access control entries and adding the access control entry to the first portion of the set of configuration data for controlling access to the memory segment by the master circuits.

12. The method of claim 11, wherein the computing of the mask-value pairs includes:
- for each mask-value combination,
  - determining if the mask-value combination validates at least one of the IDs included in an allowed list and invalidates IDs included in a disallowed list;
  - in response to the mask-value combination being valid, adding a mask-value solution, indicating each master validated by the mask-value combination, to an initial list of mask-value combinations; and selecting a smallest subset of the mask-value solutions in the initial list that indicate all of the master circuits for the subsystem.

13. The method of claim 12, wherein the selecting of the smallest subset of the mask-value solutions in the initial list includes:

moving a mask-value solution from the initial list that indicates the largest number of the IDs for the subset to a final list of mask-value combinations;

removing IDs indicated by the selected mask-value solution from other mask-value solutions in the initial list; and repeating the moving and removing steps, in response to the mask-value combinations in the final list indicating less than all of the IDs for the subset.

14. The method of claim 10, further comprising:

storing the set of configuration data in a non-volatile memory coupled to the programmable IC, wherein the programmable IC is configured to retrieve the set of configuration data from the non-volatile memory when powered on.

15. The method of claim 14, further comprising:

in response to the programmable IC being powered on, retrieving the set of configuration data from the non-volatile memory;

configuring the programmable resources of the programmable IC, using the second portion of configuration data to implement the circuitry specified by the circuit design; and using the memory management circuit in the programmable IC, restricting access to each segment of a memory of the programmable IC, indicated in the first portion of the set of configuration data, to ones of the master circuits indicated by the corresponding access control entry corresponding to the memory segment.

16. The method of claim 10, wherein the user interface is configured to display a hierarchical arrangement of subsystems defined for the circuit design, and memory segments defined for each subsystem.

17. The method of claim 16, wherein for each memory segment in the hierarchical arrangement, the user interface displays a defined address range of the memory segment and permissions for accessing the memory segment by defined master circuits of the subsystem including the memory segment in the hierarchical arrangement.

18. The method of claim 17, wherein for each memory segment in the hierarchical arrangement, the user interface further displays an indicator whether or not access to the memory segment is exclusive to the subsystem.

* * * * *